United States Patent [19]
Martin

[11] Patent Number: 5,973,524
[45] Date of Patent: Oct. 26, 1999

[54] OBTAINING ACCURATE ON-CHIP TIME-CONSTANTS AND CONDUCTANCES

[75] Inventor: Kenneth W. Martin, Toronto, Canada

[73] Assignee: Silsym, Inc., Toronto, Canada

[21] Appl. No.: 09/047,751

[22] Filed: Mar. 25, 1998

[51] Int. Cl.$^6$ ...................................................... H03L 7/06
[52] U.S. Cl. ............................ 327/156; 327/158; 307/39
[58] Field of Search ................................. 307/38, 39, 41; 327/403, 404, 405, 155, 158, 538, 156

[56] References Cited

U.S. PATENT DOCUMENTS

| | | | |
|---|---|---|---|
| 5,070,332 | 12/1991 | Kaller et al. ............................. | 341/156 |
| 5,223,743 | 6/1993 | Nakagawara ........................ | 307/296.1 |
| 5,585,754 | 12/1996 | Yamashina et al. .................... | 327/158 |

OTHER PUBLICATIONS

J.M. Steiniger, "Uderstanding Wide–band MOS Transistors", IEEE Circuits and Devices, vol. 6, No. 3, pp. 26–31, May 1990.

J. Ryan et al, "A Magnetic Field Sensitive Amplifier with Temperature Compensation", ISSCC Digest of Technical Papers, pp. 124–125, Feb. 1992.

T. H. Lee, "The Design of CMOS Radio–Frequency Itegrated Circuits", Cambridge University Press, pp. 235–237, 1998.

D.J. Johns and K. Martin, "Analog Integrated Circuits Design", John Wiley & Sons, Inc., pp. 248–250, 256–260, 1997.

W. Chan et al, "A 622 —MHz Interpolating Ring VCO with Temperature Compensation and Jitter Analysis", 1997 International Synopsium on Circuits & Systems, pp. 25–28, Jun. 1997.

*Primary Examiner*—Timothy P. Callahan
*Assistant Examiner*—Jung Ho Kim
*Attorney, Agent, or Firm*—Barry R. Lipsitz

[57] ABSTRACT

A bias circuit for obtaining accurate on-chip time constants and resistances. The bias circuit includes a constant-$g_m$ bias circuit and feedback loop circuit. The constant-$g_m$ bias circuit has a mos transistor device and a variable resistor device which are arranged so that the trandsconductance of the transistor device is dependent upon the resistance of the resistor device. The constant-$g_m$ bias circuit generates a bias output signal that is a function of the trandsconductance of the transistor device. The feedback loop circuit includes signal generation means responsive to the bias output signal for generating a signal that is a function of the bias signal. The loop circuit further includes a comparison means for comparing the generated signal to a known external frequency reference, and an output that is operatively connected to the variable resistor device for adjusting the value of the variable resistor device until the generated signal matches the external reference signal. Also provided is a variable resistor device for use in a loop circuit (including the present bias circuit). The resistor device includes an analog-controlled resistor device and a digitally-controlled resistor device. The analog-controlled resistor device is adjusted in response to variations occurring in a control signal between a maximum voltage and a minimal voltage. The digitally-controlled resistor is adjusted in discrete steps whenever the control voltage reaches the maximum or minimum voltage, after which the control voltage is forced to a value approximately half-way between the minimum and maximum voltage.

20 Claims, 6 Drawing Sheets

OBTAINING ACCURATE ON-CHIP TIME-CONSTANTS AND CONDUCTANCES

BACKGROUND OF INVENTION

The present invention relates to the field of integrated circuits, and in particular to a bias circuit for obtaining accurate on-chip time constants and conductances, and a variable resistor circuit for use with a bias circuit.

Generally, it is difficult to realize precise and consistent on-chip impedances levels in an integrated circuit. On-chip impedances are typically realized by transistors biased in the triode region, or by on-chip resistors. When a MOS transistor is used to approximate a resistor, variations in drain-source conductances makes impedance levels difficult to predict. Drain-source conductance can vary as a result of a number of different factors, with the temperature dependence of carrier mobility being a major factor. The resistivity of on-chip resistors can vary as a result of a number of different factors, including manufacturing process fluctuations which affect carrier concentrations, and also the temperature dependence of carrier mobility. The impedance of "identical" on-chip resistors can easily vary by 30% from wafer to wafer at room temperature, and can vary by over 100% with temperature changes.

The difficulty in predicting impedance levels in integrated circuits affects, among other things, the predictability of the gain of an integrated circuit as such gain is often determined by the ratio of transistor transconductance to the conductance of on-chip resistors.

In many integrated circuits which make use of MOS technology, the speeds realized by the circuits are dependent on the ratio $g_m/C$ (where $g_m$ represents the proportionality between the drain current and gate-source voltage of a MOSFET transistor in the active or saturation region and C=the value of an on-chip capacitor). However, as mentioned above, drain-source conductance can vary with temperature fluctuations, thus making on-chip time constants difficult to accurately predict control. The unpredictability of time constants makes it difficult to accurately predict the speed of an integrated circuit as the speed of the circuitry is directly proportional to the time constants which are realized by the circuit. The unpredictability of time constants also makes it difficult to accurately predict the frequency response of integrated filters as such response is dependent on the time constants.

There are a number of bias circuit designs which attempt to provide predictable and stable transistor transconductances. For example, J. M. Steininger, "Understanding Wide-Band MOS Transistors," IEEE Circuits and Devices, Vol.6, No.3, pp.26–31, May 1990, discloses a constant-$g_m$ bias circuit in which transistor transconductances are matched to the conductance of a resistor. Examples of constant-$g_m$ bias circuits can also be seen in J. Ryan et al., "A Magnetic Field Sensitive Amplifier with Temperature Compensation," ISSCC Digest of Technical Papers, pp. 124–125, February 1992; and D. Johns and K. Martin, "Analog Integrated Circuit Design", Wiley, 1997. The disclosures of the above three references are hereby incorporated by reference.

The basic principle of operation of the constant-$g_m$ bias circuits disclosed in the above references is that such circuits make the gate-source voltage difference of two different sized transistors having the same (or proportional) drain currents equal to the voltage across a resistor also having the same or a proportional current. This results in a transistor transconductance that is proportional to the inverse of the resistor value with the proportionality factor being highly predictable and process and temperature independent. However, as mentioned above, precise on-chip resistances are difficult to achieve, with the result that the absolute value of transistor transconductance can not be precisely predetermined and controlled when an on-chip resistance is used.

It is therefore desirable to provide a circuit which allows accurate on-chip time constants and conductances to be precisely obtained and controlled independent of temperature, power supply, and process variations. In this respect, a circuit having an on-chip impedance solution and transistor transconductances that can be precisely predicted and controlled substantially independent of temperature, power supply and process variations is required. It is also desirable to provide a low noise variable resistor device which can be used as an on-chip impedance solution with a loop circuit for achieving a broad range of resistances.

SUMMARY OF INVENTION

The present invention provides a circuit which allows on-chip conductances and time-constants to be controlled substantially independent of temperature and process variations. It also provides a low-noise hybrid analog/digitally-controlled resistor device for use in a loop circuit.

According to one aspect of the invention, there is provided a bias circuit integrated on a semiconductor substrate, comprising a constant-$g_m$ bias circuit, and a feedback loop circuit. The constant-$g_m$ circuit includes a first MOS transistor device and a variable-resistor device arranged such that the transconductance ($g_m$) of the first transistor device is dependent on the resistance of the resistor device, and at least one output for generating a bias signal that is a function of the transconductance. The feedback loop circuit includes an input connected to the at least one output of the constant-$g_m$ bias output for receiving the bias signal, a second input for connection to an external reference signal having a predetermined frequency, an output operatively connected to the variable resistor device, signal generation means responsive to the bias signal for generating a signal that is a function of the bias signal during operation of the bias circuit, and comparison means for comparing the generated signal to the reference signal and generating a control signal on the output for adjusting the variable resistor device to cause the generated signal to match the external reference signal in a predetermined manner.

Preferably, the feedback loop circuit is either a phase-locked-loop circuit or a delay-locked loop circuit. If the feedback loop circuit is a phase-locked loop, the signal generation means can include a voltage-controlled oscillator for generating the generated signal, the oscillator having a capacitor with a capacitance value (C) and being responsive to the bias signal for generating a signal having a frequency that is representative of $g_m/C$, and the comparison means can include a phase detector for comparing the phase of the generated signal with that of the reference signal and generating the control signal to adjust the variable resistor when the phase of the generated signal does not match that of the external reference signal. A phase-frequency detector can optionally be used in place of the phase detector.

The variable-resistor device may include an analog controlled variable resistor device having a resistance that is continually adjusted in response to variations in the control signal, or a a digitally-controlled variable-resistor device having a resistance that is adjusted in discrete steps in response to variations in the control signal. Preferably, the variable resistor device is a hybrid device and includes an analog-controlled resistor device having a resistance that is continually adjusted in response to variations in the control signal, and a digitally-controlled resistor device having a resistance that is adjusted in discrete steps in response to variations in the control signal.

According to another aspect of the present invention, there is provided a variable-resistor device integrated on a semiconductor substrate for use with a feedback loop circuit that generates a control signal dependent on the adjusted value of the resistor device. The resistor device comprises an analog-controlled resistor device having a resistance that is adjusted in response to variations in the control signal occurring between a predetermined maximum voltage and a predetermined minimum voltage, and a digitally-controlled resistor device having a resistance that is adjusted in discrete steps when the control signal reaches the maximum voltage or the minimum voltage. The relative values of the analog-controlled resistor device and the digitally-controlled resistor device are selected such that after a discrete step in the value of the digitally controlled device the control signal will be forced to a post-step voltage between the maximum voltage and the minimum voltage. Preferably, the post-step voltage has a value substantially half-way between the maximum voltage and the minimum voltage.

DESCRIPTION OF THE PREFERRED EMBODIMENTS

In the following description, a bias circuit is described in which numerous specific details are set forth, such as specific circuit configurations, etc., in order to provide a thorough understanding of the present invention. It will be obvious, however, to one skilled in the art that these specific details need not be employed to practice the present invention. In other instances, well-known structures and circuits have not been shown in detail in order to avoid unnecessarily obscuring the invention.

Figure 1:
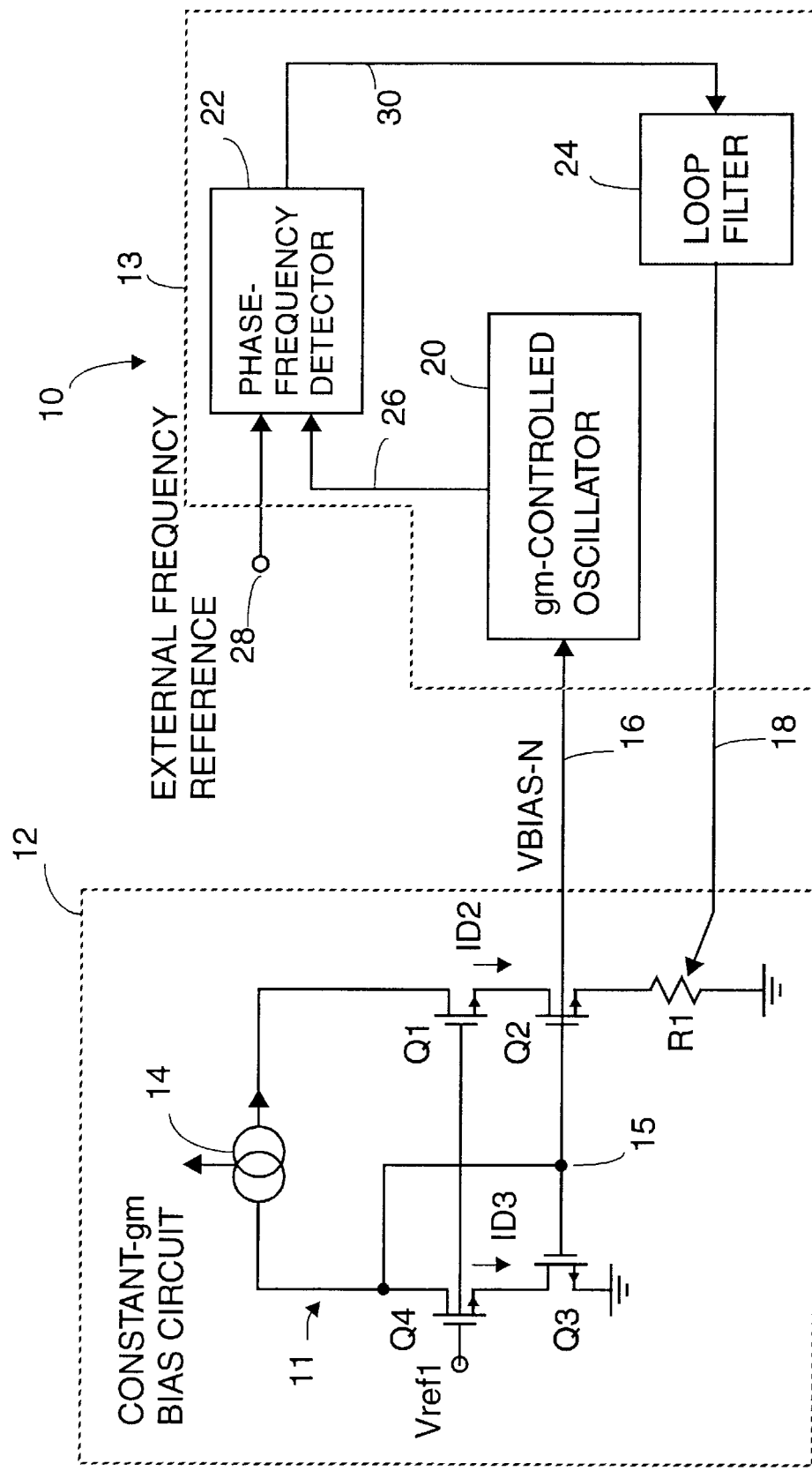
FIG. 1 is a simplified schematic/block diagram illustrating a first embodiment of a bias circuit of the present invention.

Referring to FIG. 1, a bias circuit, indicated generally by 10, is shown in accordance with one preferred embodiment of the invention. The bias circuit 10 is preferably integrated on a semiconductor substrate and includes a constant-$g_m$ bias circuit 12 and a locked reference loop circuit 13.

For the purpose of a preliminary explanation of the present invention, a simplified portion 11 of the constant-$g_m$ bias 12 is shown in FIG. 1. The constant-$g_m$ bias circuit 12 includes four n-mos transistor devices Q1, Q2, Q3 and Q4, and a variable resistor device R1. Transistors Q1 and Q4 are identical, and thus have the same W/L ratio (where W represents channel width and L represents channel length). Transistors Q2 and Q3 are different-sized transistors having different W/L ratios—for example, transistor Q2 can have a W/L ratio of 40/1 and Q3 a W/L ratio of 10/1. The $g_m$-bias circuit 12 includes a current mirror (indicated by 14 in simplified schematic 11) which is connected to the drains of transistors Q1 and Q4. The current mirror 14 preferably provides the same current to the drain of transistor Q4 as is at the drain of transistor Q1. The drain of transistor Q4 is connected through a node 15 to the gates of transistors Q2 and Q3. A bias control output line 16 is connected to node 15 (and thus to the gate of transistor Q3) for providing an n-bias voltage output signal Vbias-n. The source of transistor Q4 is connected to the drain of transistor Q3, and the source of transistor Q1 is connected to the drain of transistor Q2. The source of transistor Q3 is connected to ground, and the source of transistor Q2 is connected to ground through an on-chip variable resistor device R1.

The constant-$g_m$ bias circuit 12 operates in manner similar to the constant-$g_m$ bias circuits disclosed in the above mentioned references, except that the circuit 12 employs on-chip variable resistor device R1 rather than a fixed-value resistor device. Thus, the principle of operation behind the $g_m$-bias circuit 12 is that the difference in the gate-source voltage of the two different-sized transistors Q2 and Q3 is equal to the voltage drop across the resistor device R1. As a result, the drain-source conductance $g_{m3}$ of transistor Q3 is proportional to the inverse of the adjusted resistance of resistor device R1. The theory behind this principle of operation is as follows.

As mentioned above, the current mirror 14 provides both sides of the circuit 12 with the same current, and as a result, the drain current $I_{D3}$ of the transistor Q3 is equal to the drain current $I_{D2}$ of the transistor Q2. Considering the loop consisting of the transistors Q2, Q3 and resistor device R1 provides the equation:

$$V_{GS3} = V_{GS2} + I_{D2}R, \qquad (1)$$

where:

$V_{GS3}$=gate-source voltage of transistor Q3, $V_{GS2}$=gate-source voltage of transistor Q2, $I_{D2}$=the drain current of the transistor Q2 and R=the adjusted resistance of resistor device R1.

It is known that the effective gate-source voltage $V_{\it{eff-i}}$ of a transistor Qi is:

$$V_{\it{eff-i}} = V_{GS-i} - V_t, \qquad (2)$$

where:

$V_{GS-i}$=gate-source voltage of transistor Qi, and $V_t$=threshold voltage

Substituting equation (2) into equation (1) and subtracting the threshold voltage $V_t$ from both sides results in:

$$V_{\it{eff3}} = V_{\it{eff2}} + I_{D2}R, \qquad (3)$$

where:

$V_{\it{eff3}}$=effective gate-source voltage of transistor Q3, and $V_{\it{eff2}}$=effective gate-source voltage of transistor Q2.

It is also known that the effective gate-source voltage $V_{eff-i}$ of a transistor Qi is given by:

$$V_{eff-i} = \sqrt{\frac{2I_{Di}}{\mu_n C_{ox}(W/L)_i}} \quad (4)$$

where:
- $I_{Di}$=drain current of the transistor Qi,
- $\mu_n$=electron channel mobility,
- $C_{ox}$=gate capacitance per unit area, and
- $(W/L)_i$=ratio of channel width to channel length for the transistor Qi.

Substituting equation 4 into each side of equation (3) gives:

$$\sqrt{\frac{2I_{D3}}{\mu_n C_{ox}(W/L)_3}} = \sqrt{\frac{2I_{D2}}{\mu_n C_{ox}(W/L)_2}} + I_{D2}R \quad (5)$$

and as $I_{D3}=I_{D2}$:

$$\sqrt{\frac{2I_{D3}}{\mu_n C_{ox}(W/L)_3}} = \sqrt{\frac{2I_{D3}}{\mu_n C_{ox}(W/L)_2}} + I_{D3}R \quad (6)$$

Rearranging equation (6) provides:

$$\frac{2}{\sqrt{2\mu_n C_{ox}(W/L)_3 I_{D3}}}\left[1 - \sqrt{\frac{(W/L)_3}{(W/L)_2}}\right] = R \quad (7)$$

It is known that the equation for the transconductance $g_{m3}$ of transistor Q3 is given by:

$$g_{m3} = \sqrt{2\mu_n C_{ox}(W/L)_3 I_{D3}} \quad (8)$$

Substituting equation (7) into equation (8) provides:

$$g_{m3} = \frac{2\left[1 - \sqrt{\frac{(W/L)_3}{(W/L)_2}}\right]}{R} \quad (9)$$

Thus, it will be appreciated that the transconductance $g_{m3}$ of the transistor Q3 is determined by geometric ratios only. In the case where $(W/L)_2=4(W/L)_3$, $g_{m3}=1/R$. It should be appreciated that this equation, indeed as is true for almost all equations describing relationships in electronic circuits, is an approximation and second-order effects would modify it; however it does describe the dominant relationship with reasonably-good accuracy.

The locked reference loop circuit 13 will now be explained in greater detail. As mentioned above, the $g_m$-bias circuit 12 includes bias control output line 16 connected through node 15 to the gate of transistor Q3 for providing output bias voltage signal Vbias-n, which has a potential equal to the gate-source voltage drop across transistor Q3 and is thus dependent upon the transconductance $g_{m3}$. In the preferred embodiment of the invention shown in FIG. 1, the loop circuit 13 is a phase-locked-loop circuit, and functions to adjust the resistor R1 (and therefore the transconductance $g_{m3}$) until the output of the constant-$g_m$ bias circuit 12 reaches a predetermined value relative to an external frequency reference. In this regard, the loop-circuit 13 includes a voltage-controlled oscillator 20, a phase-frequency detector 22, and a loop filter 24. The oscillator 20 is connected to the bias control output line 16 (as well as other outputs of the circuit 12, as explained in greater detail below) so that its oscillation period is controlled by the bias output signals of the circuit 12. Thus, the oscillator 20 generates an output signal which has an oscillation period that is a function of $g_{m3}/C$, where C represents the value of an on-chip capacitor (as will be explained in greater detail below).

The phase-frequency detector 22 has two inputs 26 and 28. The output of oscillator 20 is connected to one input 26 of the phase-frequency detector 22, and an external frequency reference is connected to the other input 28. The external frequency reference signal has a pre-determined oscillation period, and the phase-frequency detector 22 detects any differences between the phase and frequency of the external frequency reference and the signal generated by the oscillator 20, and generates an output signal on line 30 in response to any differences. The signal on line 30 passes through a filter 24, onto a control line 18, which in turn is connected to the control input of the variable resistor device R1. In operation, the loop circuit 13 adjusts the value of resistor device R1, which in turn varies the transconductance $g_{m3}$, until the period and phase of the output signal generated by the $g_m$-controlled oscillator 20 matches that of the predetermined external frequency reference. Once a match has occurred, the loop circuit 13 ensures that the output of the $g_m$-controlled oscillator 20 stays locked with the external frequency reference. The external frequency reference would preferably be provided by a crystal oscillator which has an oscillating frequency normally known to be better than 99.9% accurate given both process and temperature variations.

Thus, the loop circuit 13 adjusts the resistor device R1 of the $g_m$ bias circuit 12 such that the $g_m/C$ time constants of the oscillator 20 are matched to the known period of a predetermined external reference signal. As a result, $g_m/C$ can be accurately determined. In effect, the circuit 10 functions to reference the absolute value of the transconductance $g_{m3}$ and the resistance R of the resistor R1 device to the value of the on-chip capacitor C. It will be appreciated by those skilled in the art that the variability of an on-chip capacitor resulting either from changes in temperature, or in variations from capacitor to capacitor caused by the manufacturing process, is significantly less than the variability which occurs in on-chip resistors. On-chip capacitances are usually realized using two conductive layers separated by silicon-dioxide, or alternatively by using a p-n junction diode that is biased in the reverse direction. Silicon-dioxide-type capacitors are relatively temperature independent, and typically have a capacitance which may vary from wafer to wafer by approximately 10%. The characteristics of p-n junction capacitors vary greater than those of silicon-dioxide type capacitors, but still vary significantly less than the characteristics of on-chip resistors. By adjusting the value of the resistor device R1 in order to match the $g_m/C$ time constant of the oscillator 20 to the known period of a signal, the adjusted value of device R1 has a value that will vary only to the extent that the capacitance of the on-chip capacitor C will vary. Thus, the variability of the on-chip resistor is made substantially temperature independent (as the value of C is temperature independent), and is made relatively independent of variations that occur from resistor to resistor as a result of the manufacturing process (as such variations are significantly less in on-chip capacitances). As a result, the adjusted value of device R1 is highly predictable. Furthermore, as the transistor transconductance $g_{m3}$ is proportional to the inverse of the adjusted value of resistor device R1, the variability of the transconductance will also be largely temperature and process independent.

The preferred construction and operation of circuit 12 and its components will now be discussed in greater detail. As explained above, the magnitude of the variable resistor device R1 in the constant-$g_m$ bias circuit 12 is controlled by the filtered output of the phase-frequency detector 22. The resistor device R1 can be a type of digitally-controlled on-chip resistor device which is adjustable in discrete steps, or it can be an analog-type of on-chip resistor which can be adjusted in a continuous manner using analog circuitry. An analog-type resistor device would use simpler circuitry than a digitally-adjusted resistor device, and also would not inject noise into the integrated circuit that could result from the discrete steps of a digitally-adjusted resistor device. A digitally-adjusted resistor device, on the other hand, would tend to be less sensitive to power-supply noise. Either type of resistor device circuit may be used in the present invention, with the actual choice depending upon the particular application of the bias circuit 10.

It is also possible that the resistor device R1 can be implemented using a hybrid solution in which both digital and analog-controlled resistor devices are employed. In this regard, FIG. 2 illustrates one preferred embodiment of the resistor device R1 that includes a digitally-controlled resistor device, indicated generally by 34, and an analog-controlled resistor device, indicated generally by 36.

Figure 2:
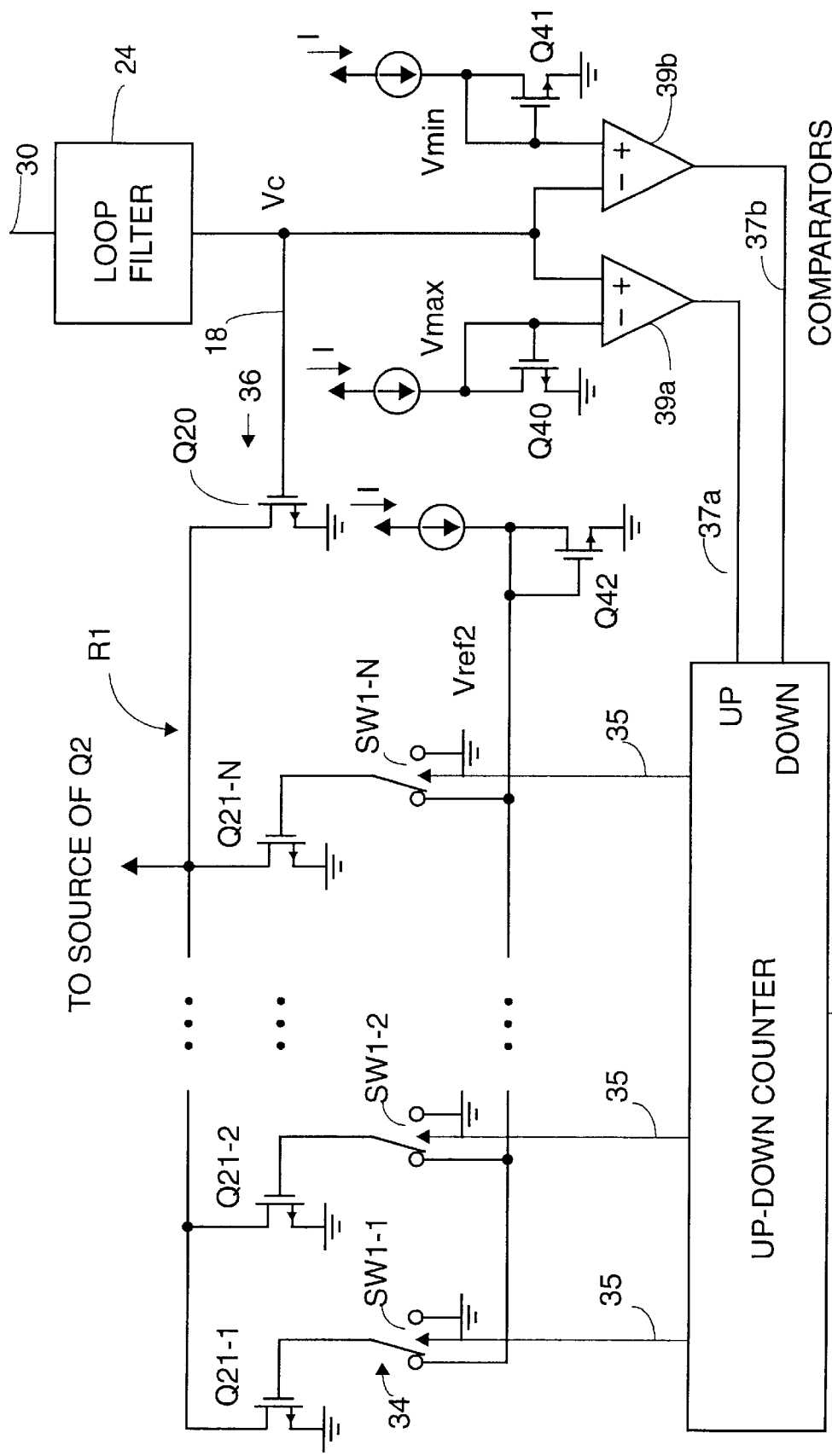
FIG. 2 is a circuit schematic of a variable-resistor device of the bias circuit of the present invention.

In the preferred embodiment of resistor device R1 illustrated in FIG. 2, the actual resistive element of the analog-controlled resistor device 36 is a n-mos transistor device Q20, and the resistive element of digitally-controlled resistor device 34 is provided by a number N of parallel connected n-mos transistor devices Q21-1 to Q21-N. It is well known in the art that a mos transistor can be used to realize a resistive element by biasing the transistor in its triode region and operating it with a small drain-source voltage drop.

The resistor device R1 is configured so that the analog-controlled resistor device 36 is used to fine tune the resistance of R1 in a continuous manner, and the digitally-controlled resistor device is used to adjust the resistance of R1 in greater, discrete, steps. The transistors Q20 and Q21-1 to Q21-N are all parallel connected in that their drains are all connected to a common node which is connected to the source of transistor Q2, and their sources are all connected to ground. The gate of the transistor Q20 is connected to the control line 18. The gates the transistors Q21-1 to Q21-N are connected to digitally controlled switch devices SW1-1 to SW 1-N, respectively. Each switch device SW1-1 to SW1-N allows the gate of its corresponding transistor Q21-1 to Q21-N to be selectively connected either to a reference voltage Vref2, or to ground. The switching operation of the switches SW1-1 to SW1-N is controlled by a conventional up-down counter 33, which has N outputs 35, each output 35 being operatively connected to one of the switches SW-1 to SW-N. Each of the outputs 35 has an active and an inactive state. When active, each output 35 causes its corresponding switch device to connect its corresponding gate to the reference voltage Vref2, and when inactive, each output 35 causes its corresponding switch device to connect its corresponding gate to ground. The reference voltage Vref2 is selected to fall within the voltage range required to bias the transistors Q21-1 to Q21-N in the triode region such that each transistor Q21-1 to Q21-N will operate with a small drain source voltage and function as a resistor when its gate is connected to Vref2. Each transistor Q21-1 to Q21-N acts as an open circuit when its gate is connected to ground.

The up-down counter 33 can be implemented using any one of a number of commonly known up-down counter circuit designs and includes an Up-input 37A and a Down-input 37B. Upon each occurrence of a low to high transition at its Up-input 37, the counter 33 activates, sequentially and cumulatively, an additional one of its outputs 35, and upon each occurrence of a low to high transistor at its Down-input 37B, the counter deactivates, sequentially, an additional one of its outputs 35.

The resistive device R1 includes two comparators 39A and 39B, each having an output operatively connected to one of the counter inputs 37A and 37B, respectively. Each of the comparators 39A and 39B has a negative and a positive input, with the positive input of the comparator 39A being connected to the control line 18, and the negative input of the comparator 39A being connected to a predetermined maximum reference voltage Vmax. The negative input of the comparator 39B is connected to the control line 18, and the positive input of the comparator 39B is connected to a further predetermined minimum reference voltage Vmin.

In operation, the output of the loop filter 24 is used to adjust the resistive value of resistor device R1. The control line 18 is connected to the gate of the transistor Q20 to provide a control voltage Vc thereto. During circuit operation, the transistor Q20 is biased in the triode region and operated with a small drain-source voltage, so that it realizes a resistor between its drain and source terminals, the resistance of which is controlled by the voltage Vc. An increase in the control voltage Vc causes a drop in the resistance of transistor Q20, and a decrease in control voltage Vc causes an increase in the resistance of transistor Q20. The range of the voltage Vc that can be applied to the gate of the transistor Q20 while still maintaining transistor Q20 in its triode, resistive, region is limited (hereinafter the control voltage range), and thus the range of resistive values that can be provided by the analog-controlled resistor device 36 is also limited. The maximum reference voltage Vmax is selected to be to close to (but lower than) the upper limit of the control voltage range, and the minimum reference voltage Vmin is selected to be close to (but higher than) the lower limit of the control voltage range.

During circuit operation, the comparator 39A will detect when the control voltage Vc on line 18 reaches the voltage Vmax, at which time the output of the comparator 39A changes from a low state to a high state, which causes the up-down counter to increment by one the number of its outputs 35 that are active, which increments by one the number of triode-biased transistors Q21-1 to Q21-N that are connected in parallel with the transist 20. (Thereby decreasing the resistance of resistor device R1 by a discrete step). Similarly, the comparator 39B detects when the voltage Vc reaches the minimum voltage Vmin, at which time the output of the comparator 39B changes from low to high, which causes the up-down counter to decrement by one the number of its outputs 35 that are active, which causes one of the transistors Q21-1 to Q21-N to effectively become an open circuit, thus reducing the number of triode biased transistors in parallel with the transistor Q20. (Thereby increasing the resistive valve of the resistor device R1 a discrete step).

The transistors Q20 and Q21-1 to Q21-N are selected such that the change in the resistance of R1 that results when one of the transistors Q21-1 to Q21-N is switched into or out of a triode state will force the control voltage Vc on line 18 to a level near the middle of the control voltage range, and preferably, approximately half-way between Vmin and Vmax. In other words, each discrete step of the digitally-controlled resistor device 34 results in a change in the control voltage Vc that is equal to approximately (Vmax−Vmin)/2.

One example of possible transistor geometries for resistor device R1 of FIG. 2 are as follows: for transistor Q20, $(W/L)_{20}$=2S; for transistors Q21-1 to Q21-N, $(W/L)_{21}$=S; for transistor Q40, $(W/L)_{40}$=9S; for transistor Q41, $(W/L)_{41}$=S; and for transistor Q42, $(W/L)_{42}$=4S. As illustrated in FIG. 2, the reference voltages Vmax, Vmin, and Vref2 are each derived from n-mos transistors Q40, Q41 and Q42, respectively. Each of the transistors Q40, Q41 and Q42 have their gates and drains connected to current sources, and their sources connected to ground. The current sources are configured so that the drain-source current of each of the transistors Q40, Q41 and Q42 is the same. It is well known that the transconductance $g_{mi}$ of a transistor is given by the equation:

$$g_{mi}=\mu_n C_{ox}(W/L)_i V_{\text{eff-}i} \qquad (10)$$

Thus, it is apparent that Veff42=2Veff41, and Veff40=3Veff41, where Veff40, Veff41, and Veff42 are the effective gate-source voltages of transistor Q40, Q41, and Q42 respectively. Thus, Vmin=Veff41 and Vmax=3Veff41. A voltage half-way between these limits is 2Veff41. If the gate voltage of transistor Q20 moves from either limit to half-way between these limits, its change in effective gate source voltage Veff20 is equal to +/− Veff41, and since $(W/L)_{20}$=2S, the change in drain source conductance of Q20 is given by:

$$\Delta g_{m20}=\pm 2\mu_n C_{ox} S V_{\text{eff}41} \qquad (11)$$

The change in drain-source admittance which results when one of the transistors Q21-1 to Q21-N has its gate connected to or disconnected from Vref2 is given by:

$$\pm g_{m21\text{-}i}=2\mu_n C_{ox} S V_{\text{eff}41} \qquad (12)$$

Thus, if the control signal Vc reaches the limit Vmax, then one of the transistors Q21-1 to Q21-N will be added in parallel to the transistors of R1 which are already connected in parallel, causing an admittance change in R1 of $\Delta g_{R1}=2\mu_n C_{ox} S V_{\text{eff}41}$, and the negative feedback of the loop will then cause the control signal Vc to drop to approximately half-way between Vmin and Vmax resulting in a change in the conductance of R1 that is equal to $\Delta g_{R1}=\Delta g_{m20}=-2\mu_n C_{ox} S V_{\text{eff}41}$. Similarly, if signal Vc reaches the lower limit Vmin, then one of the transistors Q21-1 to Q21-N will be disconnected from Vref2, causing an admitance change of $\Delta g_{R1}=-2\mu_n C_{ox} S V_{\text{eff}41}$ and the negative feedback of the loop circuit will the cause Vc to rise to approximately half-way between Vmin and Vmax as a result of the change in the conductance of R1 of $\Delta g_{R1}=\Delta g_{m20}=2\mu_n C_{ox} S C_{\text{eff}41}$.

Thus, the analog controlled resistor device 36 is used to fine tune the value of resistor device R1, and when either the upper or lower resistive limits of the device 36 are close to being reached, the value of the digitally controlled resistor device 34 will be decreased or increased a discrete step. Configuring the resistor device R1 so that after the digitally-controlled resistor device 34 increments or decrements a step the control voltage Vc will be near the middle of the control voltage range allows the gain of the analog controlled resistor device 36 to be quite small, which can minimize noise that results from the analog-controlled resistor device 36 as a result of power-supply noise and other circuit noise. By using a low-gain analog-controlled resistor device 36 to fine tune the valve of the resistor device R1, the number of discrete steps required of the digitally-controlled resistor device 34 are reduced more than if a digitally controlled resistor device was used alone to implement R1.

It will be appreciated that the preferred embodiment of the resistor R1 illustrated in FIG. 2 in effect provides a controlled hysteresis in adjusting the resistive valve of R1. Generally, once one of the transistors Q21-1 to Q21-N have been switched in or out of its triode region and the control voltage Vc on line 18 drops to halfway between Vmax and Vmin, the primary factor causing any drift in the control voltage Vc will be adjustments that occur as a result of changes in resistivity of the resistor R1 as a result of changes in temperature. In the situation where temperature changes slowly (as is usually the case), the control voltage Vc will drift slowly and stay within the range provided by Vmax and Vmin for a relatively-long time period. This maximizes the time between increments or decrements of the up-down counter 33, which in turn reduces the frequency of the noise that is introduced into the bias loop circuit 10 each time a transistor Q21-1 to Q21-N is switched in or out.

The preferred embodiment of the resistor device R1 shown in FIG. 2 offers a further advantage in that externally the device R1 approximates an analog-controlled resistor with a very wide range as substantially all the digital signals which occur within the resistor device R1 are internalized within the device R1 (with the possible exception of a clock signal) and are not sent to any external circuitry outside of resistor device R1. Additionally the effects of noise induced on the output line 18 of the loop filter 24 is minimized because the gain between the control voltage Vc and the resistive valve of the resistor device R1 is minimized by having a large number of resistive elements (i.e. transistor Q21-1 to Q21-N) which are controlled by internally generated digital signals.

The circuits used to generate the reference voltages Vref2, Vmax and Vmin can take many possible configurations which are well-known in the art, and the relative transistor geometries discussed above are exemplary.

Turning again to the constant-$g_m$ bias circuit 12, as mentioned above, only a simplified portion 11 of the constant-$g_m$ bias circuit 12 is disclosed in FIG. 1. It will be appreciated by those skilled in the art that the above analysis of the operation of simplified circuit 11 has ignored many second-order effects such as transistor output impedance and the body effect. The body effect will modify the above equations slightly, but transconductance will still depend primarily on geometry alone. In order to address the issue of transistor output impedance, the preferred embodiment of the constant-$g_m$ bias circuit is implemented using wide-swing cascode current mirrors in the manner described below. When cascode mirrors are used, the constant-$g_m$ bias circuit includes a positive feedback loop. This loop will be stable so long as loop gain is less than unity, which is the case when $(W/L)_{Q2}/(W/L)_{Q3}>1$. However, the constant-$g_m$ bias circuit can also have a second stable state where all currents are zero. In order to prevent against the occurrence of this zero current stable state, the preferred constant-$g_m$ bias circuit requires a start-up circuit.

Figure 3:
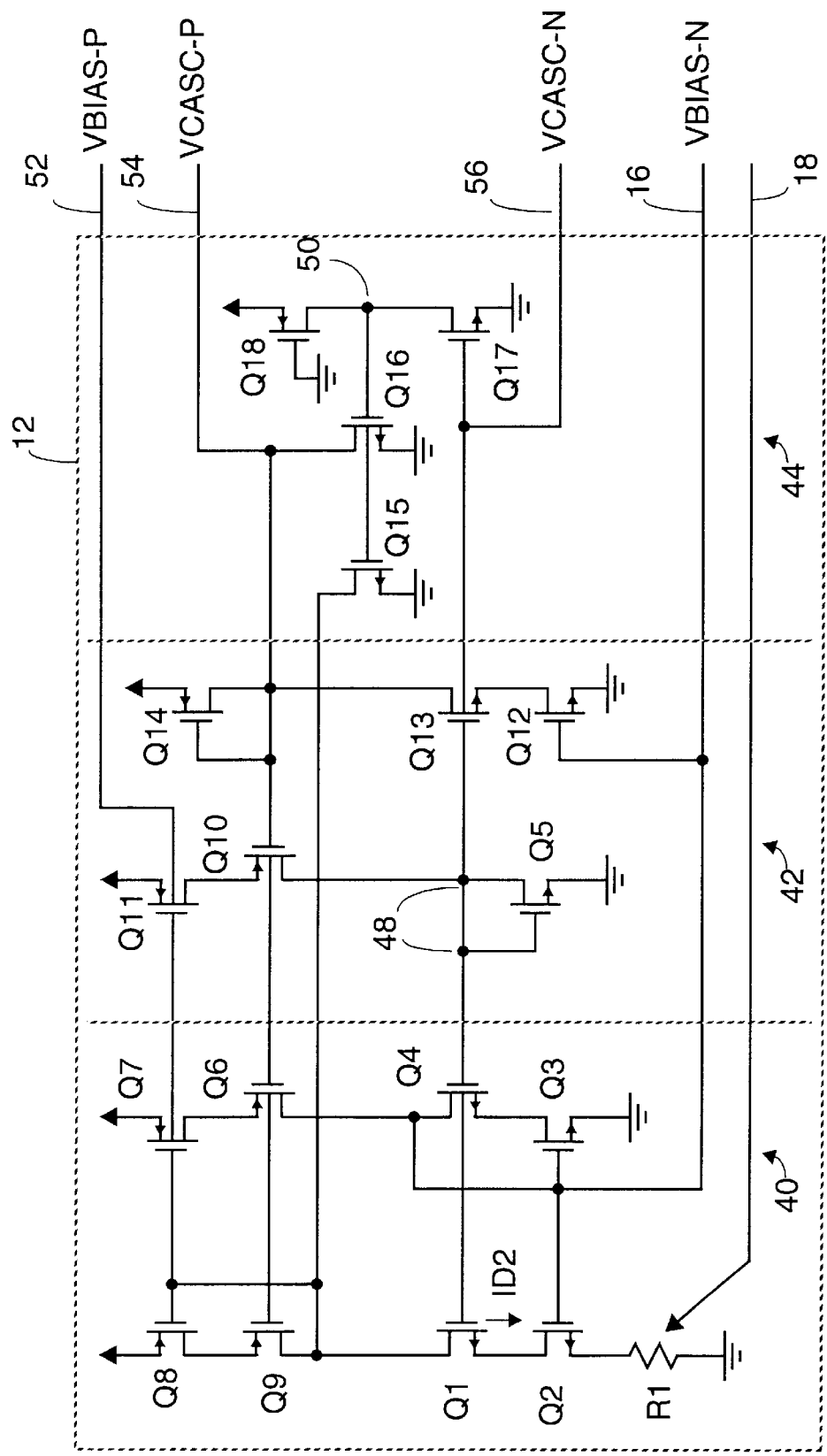
FIG. 3 is a circuit schematic of a preferred constant-$g_m$ bias circuit of the bias circuit of the present invention

The preferred embodiment of the constant-$g_m$ bias circuit 12 is shown in FIG. 3, and includes a bias circuit 40, a cascode bias circuit 42 and a start-up circuit 44. The constant-$g_m$ bias circuit 12 illustrated in FIG. 3 is configured to supply cascode bias voltages while maintaining large signal swings, which can help to minimize error which can occur as a result of power-supply noise and finite output impedances.

The bias loop 40 includes the transistors Q1 to Q4 and resistor R1 of the simplified constant-$g_m$ bias circuit 11. The bias loop 40 further includes four p-mos transistor devices Q6, Q7, Q8 and Q9, with the sources of transistors Q7 and Q8 each being connected to a power supply $V_{DD}$. The drains of transistors Q8 and Q7 are connected to the sources of transistors Q9 and Q6, respectively, and the drains of transistors Q9 and Q6 are connected to the drains of Q1 and Q4, respectively. The gates of the transistors Q6 and Q9 are connected together. The gates of the transistor Q7 and Q8 are connected together and to the drains of transistors Q9 and Q1.

The cascode bias circuit 42 includes three n-mos transistor devices Q5, Q12 and Q13, and three p-mos transistor devices Q10, Q11 and Q14. The sources of transistor Q11 and Q14 are each connected to the power supply $V_{DD}$, and the sources of transistors Q5 and Q12 are each connected to ground. The transistors Q14 and Q5 are each diode-connected, with the gate and drain of transistor Q14 being connected to a node 46 (which is also connected to the gates of transistors Q10, Q6 and Q9), and the gate and drain of transistor Q5 being connected to a node 48 (which is also coupled to the gates of transistor Q13, Q4 and Q1). The drain of transistor Q11 is connected to the source of transistor Q10, the drain of which is connected to node 48. The drain of transistor Q12 is connected to the source of transistor Q13, the drain of which is connected to node 46. The gate of transistor Q11 is connected to the gates of transistor Q7 and Q8, and the gate of transistor Q12 is connected to the gates of transistors Q2 and Q3.

The start-up circuitry 44 includes three p-mos transistor devices Q15, Q16 and Q17, and a small W/L p-mos transistor device Q18. The source of transistor Q17 is connected to ground, and its gate is connected to the node 48. The drain of Q17 is connected through a node 50 to the gates of transistor Q16 and Q15 and the drain of transistor Q18. The gate of transistor Q18 is connected to ground, and its source is connected to the power supply $V_{DD}$. The drain of transistor Q16 is connected to node 46, and its source is connected to ground. The drain of transistor Q15 is connected to the bias circuit 40, and in particular, to the gates of transistors Q7 and Q8 and the drains of transistors Q9 and Q1. The source of transistor Q15 is connected to ground.

The transistors Q1–Q4, along with diode-connected transistor Q5 act as an n-channel wide-swing cascode current mirror. The transistor pair Q3 and Q4 act similar to a diode-connected transistor at the input side of the mirror. The n-channel current mirror output current, $I_{D2}$, comes from transistor Q1. The gate voltages of cascode transistors Q1 and Q4 are derived by the diode-connected transistor Q5. The current for biasing transistor Q5 is derived, through transistors Q10 and Q11, from the bias loop 40.

Similarly, the transistors Q6-Q7, along with diode connected transistor Q14 act as a p-channel wide-swing cascode current mirror. The transistor pair Q8 and Q9 operate as a diode-connected transistor at the input side of the mirror. The output current of the p-channel current mirror is the drain current of transistor Q6. The cascode transistors Q6 and Q9 have gate voltages derived from the diode-connected transistor Q14, which has a bias current derived from the bias loop 40 via transistors Q12 and Q13 .

Start-up circuit 44 is provided to ensure that during start up of the bias loop 40 the current in all transistors will not remain equal to zero forever (the second stable state mentioned above). The start-up circuit 44 is configured so that it will only affect the bias loop 40 when all currents in the loop are zero. In the event that all currents in the bias loop 40 are zero, then the transistor Q17 will be in an off-state. Transistor Q18 acts as a high-impedance load that is always on, and accordingly, when Q17 is off, transistor Q18 will pull the gates of transistors Q15 and Q16 high. These transistors will then inject current into the bias loop 40, thus starting it up. Once current begins to flow in the bias loop 40, the transistor Q17 is placed in an on-state so that it sinks all of the current from transistor Q18 and pulls the gates of transistors Q15 and Q16 low, thereby turning them off so they no longer affect the bias loop 40.

The constant-$g_m$ bias circuit 12 includes four bias signal outputs, namely bias signal output line 16 for the bias signal Vbias-n, bias signal output line 52 (connected to the gates of transistors Q7 and Q8) for providing a bias signal Vbias-p, bias signal output line 54 (connected to node 46) for providing a bias signal Vcasc-p, and bias signal output line 56 (connected to node 48) for providing a bias signal Vcasc-n. Although the bias signals can be used for a variety of purposes, the signal Vbias-n is particularly suited for biasing n-channel transistor current sources, the signal Vbias-p for biasing p-channel transistor current sources, and the signals Vcasc-p and Vcasc-n for providing bias cascode voltages.

It will be appreciated that the constant-$g_m$ bias circuit of the present invention could be implemented in many different ways, and the preferred circuit 12 illustrated and described herein is only one example of an acceptable circuit configuration.

Figure 4:
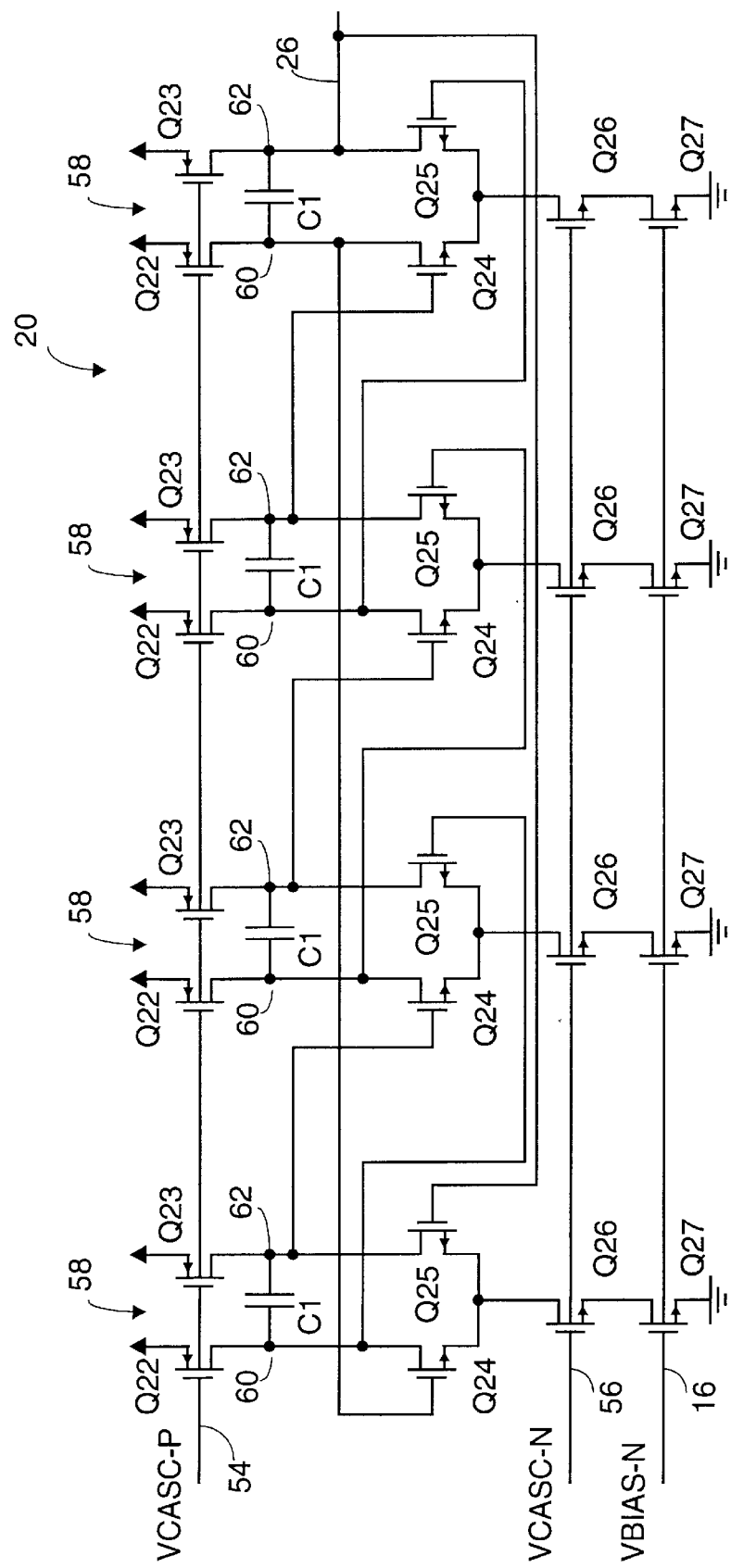
FIG. 4 is a circuit schematic of a preferred voltage-controlled oscillator of the bias circuit of the present invention.

The construction and operation of the feedback reference loop circuit 13 will now be described in greater detail. FIG. 4 illustrates a preferred embodiment of the $g_m$-controlled oscillator 20. The oscillator 20 is made up of a number of cascaded inverter circuits 58, with the outputs of the last inverter circuit 58 being connected back to the inputs of the first inverter circuit 58 in such a manner that the loop gain is inverting. The oscillator 20 of FIG. 4 is a ring oscillator including four cascaded inverter circuits 58 and is described in A. Buchwald and K. Martin, "High-Speed Voltage-Controlled Oscillator With Quadrature Outputs", *Electronic Letters*, Vol. 27, No. 4, pp. 309–310, Febuary. 1991, and in A. Johns and K. Martin, Supra, at pp. 675–679. The disclosures of both of these references are hereby incorporated by reference.

Each of the inverter circuits comprises two p-mos transistors Q22 and Q23, four n-mos transistors Q24, Q25, Q22 and Q27, and a capacitor, C1. The sources of the transistors Q22 and Q23 are each connected to the power supply $V_{DD}$, and their drains are connected to the drains of the transistors Q24 and Q25, respectively. The sources of the transistors Q24 and Q25 are each connected to the drain of the transistor Q26, the source of which is connected to the drain of the transistor Q27. The source of the transistor Q27 is connected to ground. A capacitor C1, having a capacitance C, is connected at its opposite sides to nodes 60 and 62 across the drains of the transistor Q22 and Q23. The gates of the transistor Q22 and Q23 of each of the inverters 58 are connected to the output 54 of the constant-gm bias circuit 12 to receive the bias signal Vcasc-p. The gate of the transistor Q26 of each of the inverters 58 is connected to the output 56 of the circuit 12 to receive the bias signal Vcasc-n. The gate of the transistor Q27 of each of the inverters 58 is connected to the output of the circuit 12 for receiving the bias signal Vbias-n. The gates of the transistors Q24 and Q25 of the first inverter 58 are each connected to the nodes 60 and 62, respectively, of the final inverter 58. The gates of the transistors Q24 of the second, third and fourth inverters 58 are each connected to the node 62 of the preceding inverter 58, and the gates of the transistor Q25 of the second, third and fourth inverters 58 are each connected to the node 60 of the preceding inverter 58. The output signal of the oscillator 20 is provided at the node 62 of the fourth and final inverter 58, and is connected to the input 26 of the phase-frequency detector 22.

Although the oscillator 20 has been shown and described above as having four inverter circuits 58, it will be appreciated that the oscillator 20 could include a greater even number of inverter circuits 58. Furthermore, many alternative circuit realizations of the inverter circuits are possible.

The oscillator 20 has a period of oscillation equal to twice the delay around the loop provided by the inverters 58. In particular, the period of oscillation, T, of the oscillator 20 is provided by the equation:

$$T = 2n\tau_{inv} \qquad (13)$$

where:

n=the number of inverters in the oscillator; and

τinv=the delay caused by each of the inverters 58

It will be appreciated that the delay caused by each of the inverters 58 is a function of the bias voltages Vcasc-p, Vcasc-n and Vbias-n that are applied to each of the inverters 58. In particular, assuming that the gain of each inverter 58 is large enough and the rise and fall times at the inverter inputs are small enough so that effectively the differential pair at the input of each inverter changes instantaneously, then the delay of each inverter is approximately:

$$\tau_{inv} = \Delta V_{out} \frac{C_L}{I_{D26}} \qquad (14)$$

where:

$I_{D26}$ is the drain current of transistor Q26, $\Delta V_{out}$ is the change in voltage at the output of the inverters, and $C_L$ is the load capacitance of the inverters.

As $\Delta V_{out}$ is approximately given by $I_{D26} r_{DS22}$, then:

$$\tau_{inv} \tilde{=} r_{DS22} C_L. \qquad (15)$$

This expression is moderately accurate but has minor errors. Thus, $$\tau_{inv} \cong \frac{C_L}{g_{DS22}} = K \frac{C_L}{g_{mi}}, \qquad (16)$$

where $g_{mi}$ is the transconductance of any of the transistors in the inverter, and K is a process independent constant that is related to the fact that the delay is primarily a function of the conductances at the inverter output nodes (i.e. the drain-source conductances of transistors Q22 and Q23 in FIG. 4 which are proportional to the transconductances in the bias circuit 12) and secondly of the transconductances of the input transistors which are also proportional to the transconductances in the bias circuit 12. The reason for the secondary dependance on the input-transistor transconductances is that in reality the inverter input rise and fall times are not zero and the gain of the inverter is not infinite. The particular value for K is application dependent and would normally be accurately pre-determined using computer simulation which also takes into account other second-order effects.

Since the bias voltages Vcasc-p, Vasc-n, and Vbias-n are provided to the oscillator 20 from the outputs 54, 56 and 16, respectively, of the constant-$g_m$-bias circuit 12, all currents in the oscillator 20 are proportional to currents in the constant-$g_m$ bias circuit 12 and the transconductances of all transistors in the inverters 58 are proportional to the transconductances in the constant-$g_m$ bias circuit 12. Any transistors biased in the triode region in the oscillator 20 are also proportional to the transconductances in the constant-$g_m$ bias circuit 12. Accordingly, the frequency of oscillation (1/T) of the oscillator 20 is proportional to $g_{m3}/C_L$. Thus, the frequency of oscillation is proportional to the transconductance $g_{m3}$ in the bias circuit 12, which in turn is proportional to 1/R, the inverse of the adjusted value of resistor device R1.

The phase-frequency detector 22 of the loop circuit 22 is preferably a conventional phase-frequency detector of well-known design. One suitable phase-frequency detector 22 is the circuit described in D. Johns and K. Martin, Supra, at pp. 668, 670, the disclosure of which is hereby incorporated by reference. The phase frequency detector 22 has an output (on line 30) that has an average value proportional to the phase-difference of the external frequency reference (input on line 28) and the output of the $g_m$-controlled oscillator (input on line 26).

The loop filter 24 of the loop circuit 22 functions to extract the average value from the output of the phase-frequency detector 22 and attenuate any high-frequency components of the phase-frequency detector 22 output. One example of suitable loop-filter 24 is the loop-filter illustrated in D. Johns and K. Martin, Supra, at FIG. 16 on page 663 thereof, the disclosure of which is hereby incorporated by reference.

In use, the outputs 16, 52, 54 and 56 of the constant-$g_m$ bias circuit 12 are also the outputs of the bias circuit 10 and can be used to provide the bias signals Vbias-n, Vbias-p, Vcasc-p and Vcasc-n to various load circuits. By way of example, the bias signal Vcasc-n can be used to bias n-channel transistors in the triode region, the bias signal Vcasc-p can be used to bias p-channel transistor in the triode region, and the signals Vbias-n and Vbias-p can be used for current sources, however each of these bias signals could be used for other purposes as well. The outputs of the circuit 10 can be used to provide its load circuits with stable transconductances.

Because the transconductance $g_{m3}$ is stabilized, so also is the transconductance of all transistors which derive their respective bias currents from the bias circuit 10. Thus, for all n-channel transistors which derive a transistor current from the bias circuit 10, the transistor transconductance is given by:

$$g_{mi} = \sqrt{\frac{(W/L)_i I_{Di}}{(W/L)_3 I_{D3}}} * g_{m3} \qquad (17)$$

and for all p-channel transistors, $$g_{mi} = \sqrt{\frac{\mu_p (W/L)_i I_{Di}}{\mu_n (W/L)_3 I_{D3}}} * g_{m3} \qquad (18)$$

Figure 5:
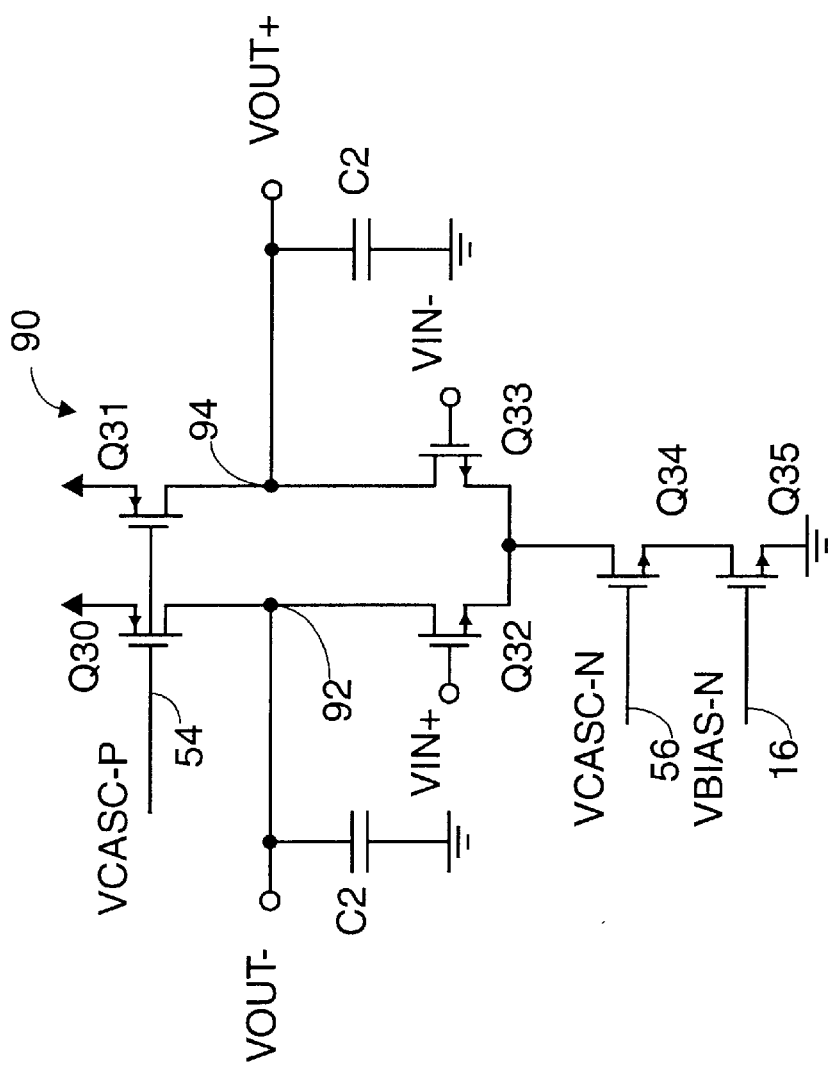
FIG. 5 is a schematic of an exemplary load circuit for use with the bias circuit of the present invention.

FIG. 5 illustrates an exemplary load circuit, indicated generally by 90, for use with the bias circuit 10. The circuit 90 is biased by the bias circuit 10 to realize a differential amplifier. The differential amplifier circuit 90 includes two p-mos transistors Q30 and Q31, and four n-mos transistors Q32, Q33, Q34 and Q35. The sources of transistors Q30 and Q31 are connected to a power supply $V_{DD}$, and their drains are connected to nodes 92 and 94, respectively. The drains of transistor Q32 and Q33 are connected to nodes 92 and 94, respectively, and their sources are each connected to the drain of transistor Q34. The source of transistor Q34 is connected to the drain of transistor Q35, and the source of transistor Q35 is connected to ground. The amplifier circuit 90 is biased by connecting the gates of the transistors Q30 and Q31 to the output 54 of the bias circuit 10 to receive bias signal Vcasc-p, connecting the gate of the transistor Q34 to the output 56 to receive bias signal Vcasc-n, and connecting the gate of the transistor Q35 to the output 16 to receive the bias signal Vbias-n. The gate of transistor Q32 is the positive voltage input of amplifier circuit 90, and the gate of transistor Q33 is the negative voltage input. Node 94 is the positive output and node 92 is the negative output. As illustrated in FIG. 5, the amplifier circuit 90 is shown with a capacitive load, represented by two capacitors C2 which are connected to nodes 92 and 94 respectively. The capacitive load would be used to make the circuit 90 operate more slowly, for example to realize a longer delay or a first-order low pass filter. When capacitors C2 are not present, the capacitive load of the circuit 90 is realized by parasitic capacitances. In the present example, the transistors Q30 and Q31 are biased in the triode region to realize resistive loads. The transistors Q34 and Q35 realize a wide-swing current source which will have currents proportional to the currents in constant-$g_m$ bias circuit 12. The gain of the circuit 90 is given by $g_{m32}/g_{ds30}$, and the unity-gain frequency (i.e. speed) of the circuit 90 is given by $g_{m32}/C2$. As $g_{m32}$ and $g_{ds30}$ are proportional to 1/R of the constant-$g_m$ bias loop, which is proportional to the accurately—known frequency of the external frequency references, all transconductances and resistive values of the circuit 90 are substantially stabilized and the effects of temperature and manufacturing variations are minimized.

Thus, the bias circuit 10 of the present invention can be used to control transconductances of load transistors and the $g_m/C$ time constants of integrated circuits which have speeds dependent on $g_m/C$ time constants (which a great majority of integrated circuits have), and which have their transconductances determined by the bias circuit 10.

As suggested above, the bias circuit 10 can be used to bias transistors in the triode region so that such transistors can be used as accurate, temperature independent, on-chip resistors. As mentioned previously, the transconductance $g_{mi}$ of a transistor biased in the active or saturation region, with a drain-source voltage greater than its effective gate-source voltage, is given by equation (10), and the effective gate-source voltage $V_{\mathit{eff-i}}$ is illustrated at (4). It is well understood by those skilled in the art that the drain-source conductance of a transistor which has a drain-source voltage much smaller than its effective gate source-voltage is given by an equation the same as (10) above. Accordingly, a transistor which is biased in the triode region and which is being used to approximate a resistor will have a drain-source conductance that is accurately matched to the transconductance $g_{m3}$ of the transistor Q3 in the $g_m$-bias circuit 12 if its effective gate-source voltage is the same as the effective gate-source voltage of the transistor Q3 of the $g_m$-bias circuit 12.

It will be appreciated that the control circuit used to control the digital resistor device 34 could also be used to adjust other remote resistor devices in the integrated circuit which are matched to the resistor R1. Such remote resistor devices would not require analog control, and could be sufficiently implemented using a circuit similar to that of the digitally-controlled resistor device 34 without including the analog-controlled resistor device 36, as the gain of the analog device of R1 would be small enough to allow sufficiently close matching by use of digital adjustment alone in remote resistor devices. Thus, such remote resistors devices can be digitally-adjusted without any analog adjustment, and would therefore not generate the noise associated with such analog resistor devices.

It will be appreciated that the bias circuit 10 of the present invention could be implemented using circuit elements other than those described above. For example, the resistor device R1 could be constructed with actual resistors used in place of the triode-region-biased transistors. Additionally, the phase-frequency detector 22 could be replaced with a simple phase detector without frequency detection. An example of a suitable phase detector is shown in D. Johns and K. Martin, 662–663, the disclosure of which is hereby incorporated by reference.

Figure 6:
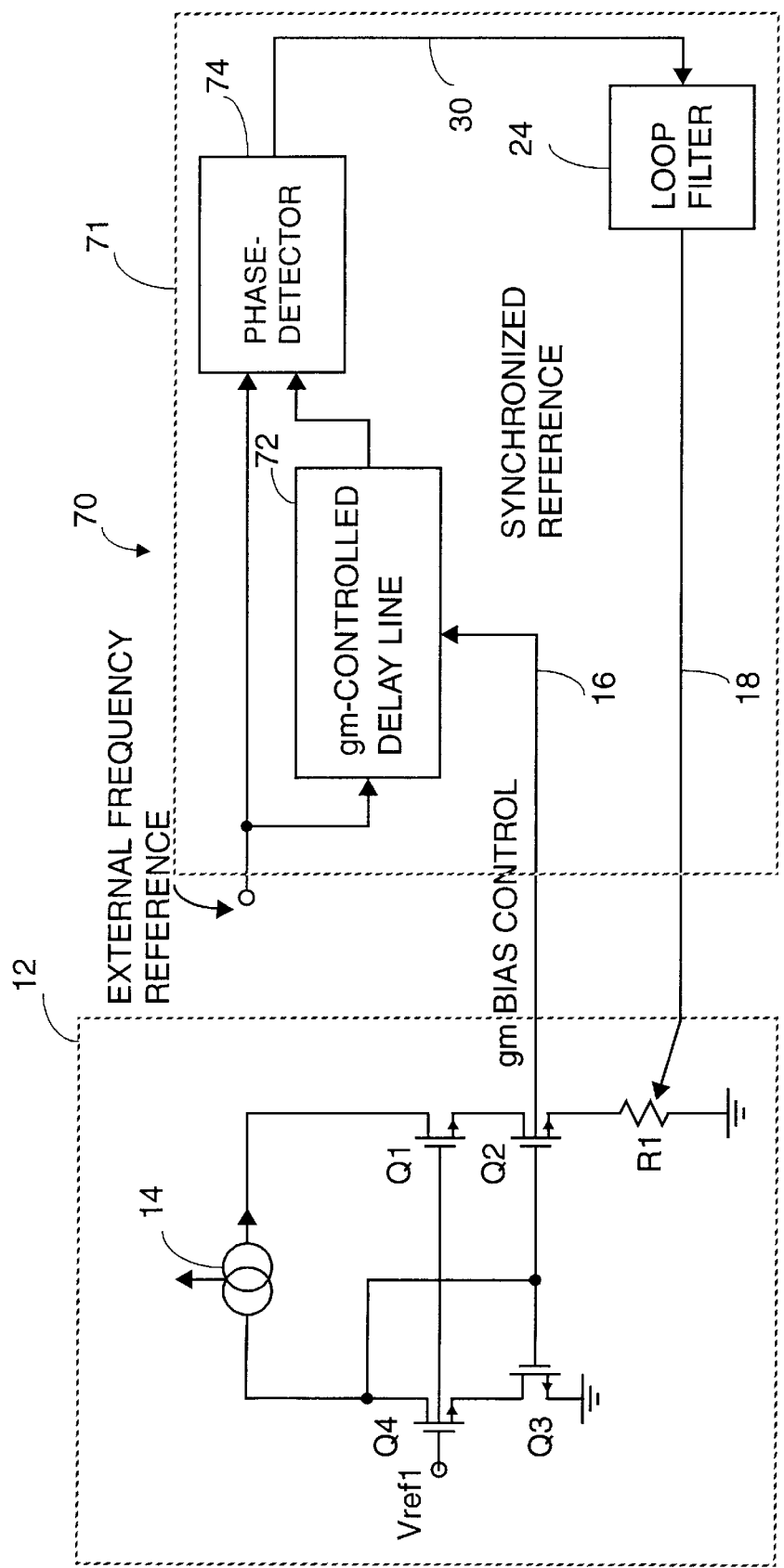
FIG. 6 is a simplified schematic/block diagram illustrating a second embodiment of the bias circuit of the present invention.

It will further be appreciated that instead of using a phase-locked loop to reference the transconductance $g_{m3}$ to an external frequency reference, a delay-locked loop could be used instead. FIG. 6 illustrates a bias circuit 70 in accordance with a second preferred embodiment of the present invention. The bias circuit 70 is identical in operation and design to the bias circuit 10 described above except for the following differences noted hereinafter. Instead of phase-locked loop circuit 13, the circuit 70 includes a delay-locked loop circuit 71. In particular, instead of voltage controlled oscillator 20, the bias circuit 70 includes a $g_m$-controlled delay circuit 72, and instead of phase-frequency detector 22, the bias circuit 70 includes a simple phase-detector 74. The external frequency reference is input to both the $g_m$-controlled delay circuit 72 and the phase detector 74. The $g_m$-controlled delay circuit 72 delays the external frequency reference an amount that is controlled by the bias signals output from the constant-$g_m$ bias circuit 12. The phase detector 74 compares the external frequency reference with the delayed frequency reference signal, and generates an output on line 30 indicative of the phase difference between the two signals. As with the circuit 13, the signal on line 30 is passed through loop filter 24 onto line 18 and used to control the magnitude of the resistor device R1.

The delay locked loop circuit 71 can be implemented using any number of known delay-locked loop filter configurations, however one preferred circuit is that described in S. Sidropoulos and M. Horowitz, "A Semi-Digital DLL With Unlimited Phase Shift Capability and 0.08–400 Mhz Operating Range, *IEEE Int. Solid-State Circuits Conf.*, pp. 332,333, February. 1997, the disclosure of which is hereby incorporated by reference. The delay element 72 can be implemented by a cascade of a number of inverters such as the inverter shown in FIG. 5.

It will be appreciated that the analog/digitally controlled resistor device R1 of FIG. 2 could be utilized in loop circuits other than the constant-$g_m$ circuit disclosed herein.

The circuit 12 may be realized, for example, using a CMOS IC technology having a minimum channel length of 0.8 $\mu$m, with the transistors in the circuit having the following W/L dimensions:

| Transistor | W/L (in $\mu$m) |
|---|---|
| Q1 | 10/1.6 |
| Q2 | 40/1 |
| Q3 | 10/1 |
| Q4 | 10/1.6 |
| Q5 | 2.5/1.6 |
| Q6 | 20/1.6 |
| Q7 | 20/1 |
| Q8 | 20/1 |
| Q9 | 20/1.6 |
| Q10 | 20/1.6 |
| Q11 | 20/1 |
| Q12 | 10/1 |
| Q13 | 10/1.6 |
| Q14 | 5/1.6 |
| Q15 | 10/1 |

-continued

| Transistor | W/L (in μm) |
|---|---|
| Q16 | 10/1 |
| Q17 | 10/1 |
| Q18 | 2/20 (can be replaced with an actual transistor) |

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

I claim:

1. A bias circuit integrated on a semiconductor substrate, comprising:

a constant-$g_m$ bias circuit including a first MOS transistor device and a variable resistor device arranged such that the transconductance ($g_m$) of said first transistor device is dependent on the resistance of said resistor device, and at least one output for generating a bias signal that is a function of said transconductance; and a feedback loop circuit having an input connected to said at least one output of said constant-$g_m$ bias output for receiving said bias signal, a second input for connection to an external reference signal having a predetermined frequency, an output operatively connected to said variable resistor device, signal generation means responsive to said bias signal for generating a signal that is a function of said bias signal during operation of the bias circuit, and comparison means for comparing said generated signal to said reference signal and generating a control signal on said output for adjusting said variable resistor device to cause said generated signal to match said external reference signal in a predetermined manner.

2. A bias circuit according to claim 1 wherein said feedback loop circuit is a phase-locked loop circuit.

3. A bias circuit according to claim 2 wherein said signal generation means includes a voltage-controlled oscillator for generating said generated signal, said oscillator having a capacitor with a capacitance value (C) and being responsive to said bias signal for generating a signal having a frequency that is representative of $g_m/C$, and said comparison means includes a phase detector for comparing the phase of said generated signal with that of said reference signal and generating said control signal to adjust said variable resistor when the phase of said generated signal does not match that of the external reference signal.

4. A bias circuit according to claim 2 wherein said signal generation means includes a voltage-controlled oscillator for generating said generated signal, said oscillator having a capacitor with a capacitance value (C) and being responsive to said bias signal for generating a signal having a frequency that is representative of $g_m/C$, and said comparison means includes a phase-frequency detector for comparing the phase and frequency of said generated signal with that of said reference signal and generating said control signal to adjust said variable resistor when the phase and frequency of said generated signal does not match that of the external reference signal.

5. A bias circuit according to claim 1 wherein said feedback loop circuit is a delay-locked loop circuit.

6. A bias circuit according to claim 5 wherein said signal generation means includes a delay element for delaying said reference signal in response to said bias signal, and said comparison means includes a phase detector for comparing the delayed reference signal with the original reference signal and generating said control signal to adjust said variable resistor device when the phase of the delayed reference signal does not match that of the original reference signal.

7. A bias circuit according to claim 1 wherein said variable resistor device includes an analog controlled variable resistor device having a resistance that is continually adjusted in response to variations in said control signal.

8. A bias circuit according to claim 7 wherein said variable resistor device includes a mos transistor device that is biased in the triode region by said control signal during operation of the bias circuit.

9. A bias circuit according to claim 1 wherein said variable resistor device includes a digitally-controlled variable resistor device having a resistance that is adjusted in discrete steps in response to variations in said control signal.

10. A bias circuit according to claim 9 wherein said digitally-controlled variable resistor device includes a plurality of parallel connected mos transistor devices;

a reference voltage source for generating a voltage suitable to bias said parallel connected transistor devices in their triode regions;

a switching circuit for individually and cumulatively connecting and disconnecting the gates of said parallel transistor devices to said reference voltage source in response to said control signal during operation of the bias circuit.

11. A bias circuit according to claim 1 wherein said variable resistor device includes an analog-controlled resistor device having a resistance that is continually adjusted in response to variations in said control signal; and an digitally-controlled resistor device having a resistance that is adjusted in discrete steps in response to variations in said control signal.

12. A bias circuit according to claim 11 wherein the resistance of said analog-controlled resistor device is adjusted in response to variations in said control signal occurring between a predetermined maximum voltage and a predetermined minimum voltage, and the resistance of said digitally controlled resistor device is adjusted in a discrete step when said control signal reaches one of said maximum voltage and said minimum voltage, wherein after a discrete step of said digitally controlled device said control signal will be forced to a post-step voltage between said maximum voltage and said minimum voltage.

13. A bias circuit according to claim 12 wherein said post-step voltage has a value substantially half-way between said maximum voltage and said minimum voltage.

14. A bias circuit according to claim 12 wherein said analog-controlled resistor device includes a mos transistor device having its gate connected to the output of said feedback loop circuit to receive said control signal, said mos transistor device being biased in its triode region when said control signal is between said maximum voltage and said minimum voltage, and said digitally controlled resistor device includes:

a plurality of parallel connected mos transistor devices;

a reference voltage source for generating a voltage suitable to bias said parallel connected transistor devices in their triode regions; and a switching circuit for cumulatively connecting the gate of one of said parallel connected transistor devices to said reference voltage each time said control signal reaches said maximum voltage and for cumulatively connecting the gate of one of said parallel connected transistor device to ground each time said control signal reaches said minimum value, wherein said transistor device of said analog-controlled resistor device is connected in parallel with said parallel connected transistor devices.

15. A bias circuit according to claim 1 wherein said constant-$g_m$ bias circuit includes a second mos transistor device connected in series with said variable resistor device, said first and second transistor devices having different sizes and being arranged such that during operation of the bias circuit the difference between the gate-source voltage of said fist and second transistor devices is equal to the voltage across said variable resistor, thereby causing the transconductance $g_m$ of said first transistor device to be proportional to the inverse of the adjusted value of said resistor device.

16. A bias circuit according to claim 1, comprising at least one further MOS transistor device connected to said bias circuit such that said further MOS transistor device is biased by said at least one bias signal, thereby controlling the transconductance of said further MOS transistor device.

17. A bias circuit according to claim 1, comprising at least one further variable resistor device, said further resistor device being connected to said bias circuit such that said further resistor device can be varied in response to said control signal.

18. A variable resistor device integrated on a semiconductor substrate for use with a feedback loop circuit that generates a control signal dependent on the adjusted value of said resistor device, comprising:

an analog-controlled resistor device having a resistance that is adjusted in response to variations in said control signal occurring between a predetermined maximum voltage and a predetermined minimum voltage; and a digitally-controlled resistor device having a resistance that is adjusted in discrete steps when said control signal reaches one of said maximum voltage and said minimum voltage, the relative values of said analog-controlled resistor device and said digitally-controlled resistor device being selected such that after a discrete step in the value of said digitally controlled device said control signal will be forced to a post-step voltage between said maximum voltage and said minimum voltage.

19. A bias circuit according to claim 18 wherein said post-step voltage has a value substantially half-way between said maximum voltage and said minimum voltage.

20. A bias circuit according to claim 19 wherein said analog controlled resistor device includes a mos transistor device having its gate connected to an output of said feedback loop circuit to receive said control signal, said mos transistor device being biased in its triode region when said control signal is between said maximum voltage and said minimum voltage, and said digitally controlled resistor device includes:

a plurality of parallel connected mos transistor devices;

a reference voltage source for generating a voltage suitable to bias said parallel connected transistor devices in their triode regions; and a switching circuit for cumulatively connecting the gate of one of said parallel connected transistor devices to said reference voltage each time said control signal reaches said maximum voltage and for cumulatively connecting the gate of one of said parallel connected transistor device to ground each time said control signal reaches said minimum value.

* * * * *